(12) United States Patent
Makita

(10) Patent No.: US 8,143,974 B2
(45) Date of Patent: Mar. 27, 2012

(54) COPLANAR WAVEGUIDE HAVING TRENCHES COVERED BY A PASSIVATION FILM AND FABRICATION METHOD THEREOF

(75) Inventor: Takehiko Makita, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 170 days.

(21) Appl. No.: 12/457,766

(22) Filed: Jun. 19, 2009

(65) Prior Publication Data

US 2010/0079222 A1 Apr. 1, 2010

(30) Foreign Application Priority Data

Sep. 29, 2008 (JP) .................................. 2008-249794

(51) Int. Cl.
*H01P 3/08* (2006.01)
(52) U.S. Cl. ........................................ 333/238; 257/664
(58) Field of Classification Search .................. 333/238, 333/246, 33; 257/664, 728
See application file for complete search history.

(56) References Cited

U.S. PATENT DOCUMENTS

| | | | | |
|---|---|---|---|---|
| 5,194,833 A | * | 3/1993 | Dougherty et al. | 333/33 |
| 7,161,450 B2 | * | 1/2007 | Takenaka | 333/238 |
| 7,659,790 B2 | * | 2/2010 | Shaul et al. | 333/1 |
| 7,791,437 B2 | * | 9/2010 | Franson | 333/238 |
| 2004/0124956 A1 | * | 7/2004 | Ahn et al. | 333/238 |

FOREIGN PATENT DOCUMENTS

JP 2000-068714 3/2000

OTHER PUBLICATIONS

Cheng P. Wen, "Coplanar Waveguide: A Surface Strip Transmission Line Suitable for Nonreciprocal Gyromagnetic Device Applications", IEEE Transactions on Microwave Theory and Techniques, vol. MTT-17, No. 12, pp. 1087-1090 (1969).

* cited by examiner

*Primary Examiner* — Benny Lee
(74) *Attorney, Agent, or Firm* — Rabin & Berdo, P.C.

(57) ABSTRACT

A coplanar waveguide includes a signal line formed on a major surface of a high-resistivity silicon substrate, a pair of ground conductors placed on opposite sides of the signal line, and a pair of trenches formed in the substrate between the signal line and the ground conductors. Because of the trenches, the attenuation characteristics of the coplanar waveguide are highly uniform, and are comparable to the attenuation characteristics of coplanar waveguides formed on compound semiconductor substrates.

17 Claims, 11 Drawing Sheets

COPLANAR WAVEGUIDE HAVING TRENCHES COVERED BY A PASSIVATION FILM AND FABRICATION METHOD THEREOF

BACKGROUND OF THE INVENTION

1. Field of the Invention

The present invention relates to a coplanar waveguide used for interconnecting integrated circuit elements operating in the millimeter-wave frequency band or connecting such circuit elements to package connectors, and to a coplanar waveguide fabrication method.

2. Description of the Related Art

Microstrip lines and coplanar waveguides are currently used as propagation lines for microwave and millimeter-wave signals. A microstrip line has a ground conductor on the underside of the substrate. Accordingly, grounding on the upper surface of the substrate requires the formation of a via hole through the substrate. A coplanar waveguide has ground conductors formed on the upper side of the substrate, so all grounding is on the upper surface of the substrate and there is no need for via holes. Integrated circuits with coplanar waveguides can therefore be fabricated more easily and at a lower cost than integrated circuits with microstrip lines.

In a monolithic microwave integrated circuit (MMIC) with active elements such as mixers and amplifiers and passive elements such as filters and capacitors, coplanar waveguides are used to interconnect the active and passive elements. Such coplanar waveguides generally comprise metal wiring patterns, and the substrate is generally a compound semiconductor substrate such as a gallium arsenide (GaAs) or indium phosphide (InP) substrate. One advantage of a compound semiconductor substrate is that its high electron mobility permits the formation of active devices, such as metal-semiconductor field-effect transistors (MESFETs) and high electron mobility transistors (HEMTs), that can operate in the hundred-gigahertz (100-GHz) band. Another reason is that it is easy to fabricate compound semiconductor substrates having a resistivity as high as about ten million ohm-centimeters ($10^7$ Ω·cm).

Monocrystalline compound semiconductor substrates are, however, more expensive than monocrystalline silicon (Si) semiconductor substrates. Moreover, commercially available monocrystalline compound semiconductor wafers are generally only three to four inches in diameter, whereas ten-inch monocrystalline silicon semiconductor wafers are readily available. Because of the high cost and small size of monocrystalline compound semiconductor wafers, MMICs formed on monocrystalline compound semiconductor substrates are expensive.

In Japanese Patent Application Publication No. 2000-068714, Matsumoto has described the formation of coplanar waveguides in which the signal line and ground conductors are both disposed on an insulating film such as a silicon oxide film, a silicon nitride film, or a polyimide film at least ten micrometers (10 μm) thick, formed on a monocrystalline silicon semiconductor substrate with a resistivity of one thousand to ten thousand ohm-centimeters (1 kΩ·cm to 10 kΩ·cm). The insulating film reduces leakage of electromagnetic wave energy into the substrate, so that an MMIC with coplanar waveguides of this type can operate at frequencies in excess of 10 GHz despite the use of a silicon substrate.

Experiments performed by the inventor have shown that if the thickness of the insulating film is reduced to about 0.2 μm to 2 μm, the attenuation constant in the 1-GHz to 30-GHz band degrades by at least one decibel per millimeter (1 dB/mm). The reason is that a low-resistivity layer with a resistivity of about 0.01 Ω·cm forms at the interface between the silicon oxide or silicon nitride insulating film and the high-resistivity monocrystalline silicon substrate. To nullify the effect of this low-resistance layer, the insulating film must be at least about 10 μm thick.

Forming a silicon oxide or silicon nitride film at least 10 μm thick by plasma chemical vapor deposition (CVD), takes at least four to twelve hours, however, which is impractical for commercial fabrication.

For practical fabrication, accordingly, the coplanar waveguides need to be formed directly on the high-resistivity silicon wafer substrate, without an intervening insulating film, but further experiments performed by the inventor have shown that at frequencies of 60 GHz to 80 GHz, the attenuation constant of such coplanar waveguides exceeds 1 dB/mm, and the attenuation constant shows significant variations over the wafer surface.

SUMMARY OF THE INVENTION

An object of the present invention is to provide a coplanar waveguide that can carry millimeter-wave signals despite being formed directly on a silicon wafer substrate without an intervening insulating film.

In the present invention, this object is achieved by forming trenches between the signal line and the ground conductors of the coplanar waveguide.

A coplanar waveguide according to the present invention accordingly includes a high-resistivity silicon substrate, a signal line disposed on a major surface of the substrate, a pair of ground conductors disposed on the major surface on mutually opposite sides of the signal line, and a pair of trenches formed in the major surface between the signal line and the ground conductors. The trenches are preferably at least one hundred nanometers deep. The coplanar waveguide may also include a passivation film covering the signal line and the inner surfaces of the trenches, and a conductive bridge interconnecting the pair of ground conductors, passing over the signal line as an air bridge.

A method of fabricating a coplanar waveguide according to the present invention includes preparing a high-resistivity silicon substrate, forming a signal line and a pair of ground conductors on a major surface of the substrate, the signal line being disposed between the pair of ground conductors, and forming a pair of trenches in the major surface of the substrate between the signal line and the ground conductors. The trenches may be formed by an etching process such as a reactive ion etching process in which the signal line and ground conductors function as an etching mask. A passivation film may be formed to protect the signal line and the inner surfaces of the trenches, and a conductive bridge may also be formed to interconnect the ground conductors.

DETAILED DESCRIPTION OF THE INVENTION

Figure 1:
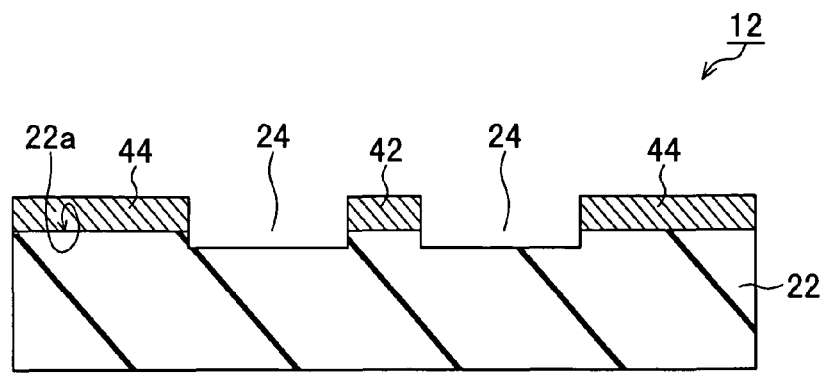
FIG. 1 is a sectional view of a coplanar waveguide embodying the present invention.

The invention will now be described in more detail with reference to the attached non-limiting drawings, in which like elements are indicated by like reference characters. Reference characters 20 and 22 will be used to denote flat and trenched substrates, respectively.

Referring to FIG. 1, an exemplary coplanar waveguide 12 embodying the present invention comprises a substrate 22 with a pair of trenches 24, a signal line 42 formed on a major surface 22a of the substrate 22 between the trenches 24, and a pair of ground conductors 44 formed on the surface of the substrate 22 on the far sides of the trenches 24. The longitudinal direction or signal propagation direction of the signal line 42 is orthogonal to the drawing sheet.

The substrate 22 is a high-resistivity monocrystalline silicon substrate with a resistivity of at least 1 kΩ·cm, although not exceeding 10 kΩ·cm. The signal line 42 and ground conductors 44 include, for example, layers of titanium (Ti), platinum (Pt), and gold (Au) as described below. The depth of the trenches 24 from the major surface 22a of the substrate 22 should be at least 100 nm, for a reason to be explained later.

Next a method of fabricating the coplanar waveguide in FIG. 1 will be described.

Figure 2:
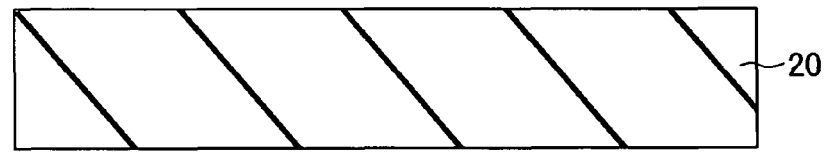
FIGS. 2 to 5 are sectional views illustrating a process for fabricating the coplanar waveguide in FIG. 1.

Referring to FIG. 2, first a high-resistivity silicon substrate 20 is prepared. The substrate 20 should have a resistivity of from 1 kΩ·cm to 10 kΩ·cm.

Next a signal line and a pair of ground conductors disposed on mutually opposite sides of the signal line are formed on the flat substrate 20 by conventional photolithography, deposition, and etching processes as follows.

Figure 3:
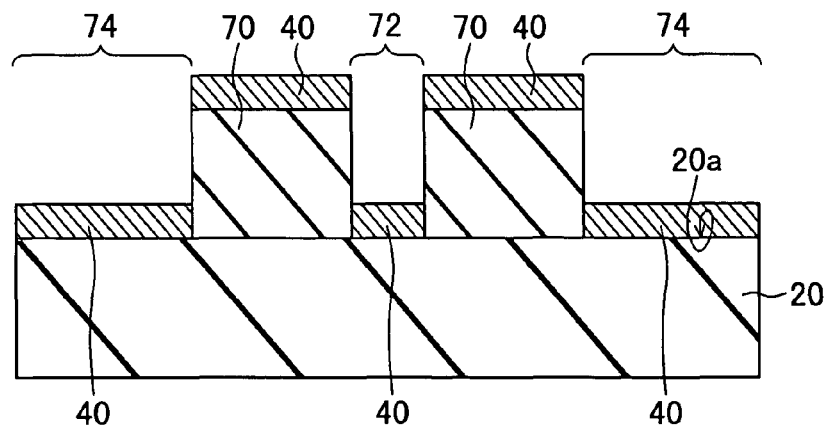

First a resist is applied to the major surface 20a of the substrate 20, exposed to light through a mask, and developed to form the resist pattern 70 shown in FIG. 3. The development process removes the resist from the region 72 where the signal line will be formed and regions 74 where the ground conductors will be formed. Next a metal film 40 is formed by evaporation deposition. The metal film 40 includes a 50-nm titanium layer, a 100-nm platinum layer, and a 500-nm gold layer.

Figure 4:
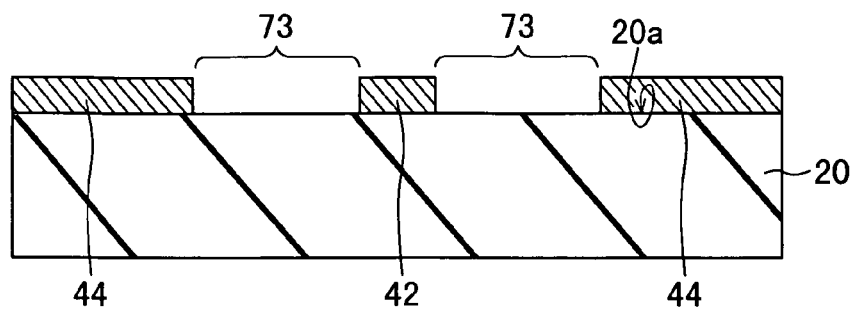

The resist pattern 70 is then removed by using, for example, an organic solvent, leaving the signal line 42 and the ground conductors 44 as shown in FIG. 4.

Figure 5:
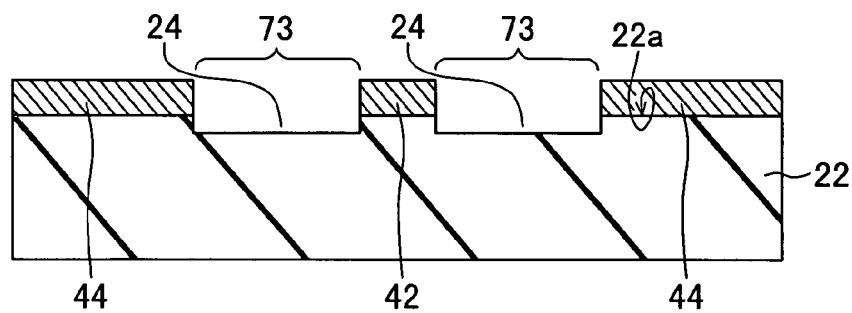

Referring to FIG. 5, after formation of the signal line 42 and the ground conductors 44, etching is performed using the signal line 42 and ground conductors 44 as a mask to form the trenches 24 in the regions 73 between the signal line 42 and the ground conductors 44 on the major surface 22a of the trenched substrate 22. This process may be carried out by, for example, reactive ion etching (RIE) using silicon hexafluoride ($SF_6$) or carbon tetrafluoride ($CF_4$) gas. Since $SF_6$ gas and $CF_4$ gas do not react with metals, the signal line 42 and the ground conductors 44 formed in the preceding deposition steps do not need to be protected by an additional mask. Alternatively, the trenches 24 may be formed by wet etching.

The trenches 24 are etched to a depth of at least 100 nm.

To reduce the electrical resistivity of the signal line 42 and the ground conductor 44, additional metal may be plated thereupon before the etching process in FIG. 4. This additional metallization process is illustrated in FIGS. 6 to 9.

Figure 6:
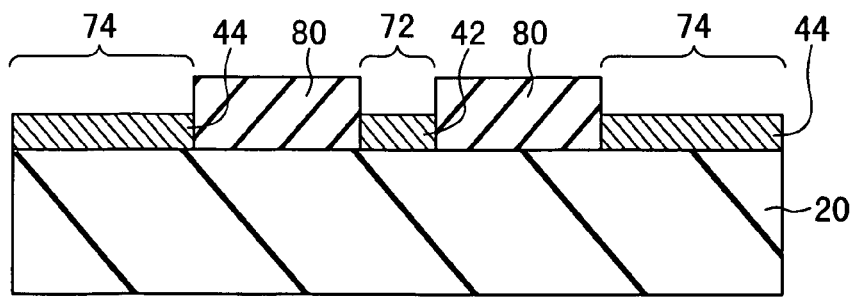
FIGS. 6 to 9 are sectional views illustrating a process for deposition of a comparatively thick metal film.

Referring to FIG. 6, after the steps through FIG. 4 have been completed, a resist pattern 80 is formed that has openings in the regions 72, 74 where the signal line 42 and the ground conductors 44 have been formed.

Figure 7:
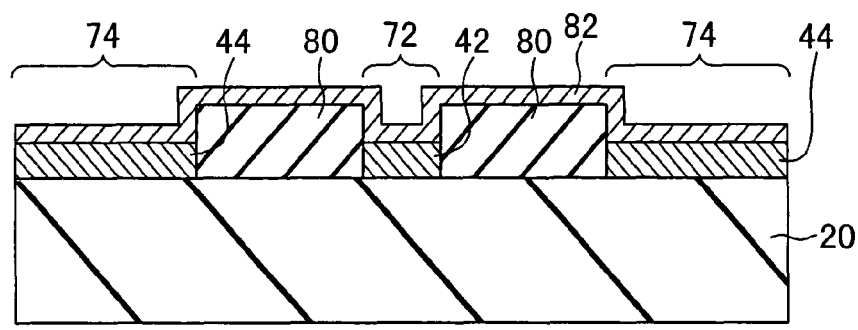

Referring to FIG. 7, a current film 82 including a 50-nm titanium (Ti) layer and a 100-nm gold (Au) layer is formed by evaporation deposition.

Figure 8:
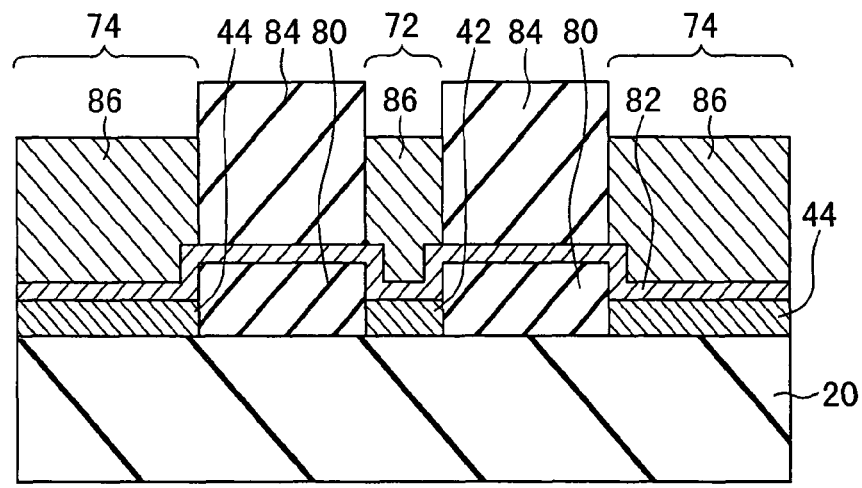

Referring to FIG. 8, a plating resist pattern 84 is formed, and then a gold layer 86 approximately 4 μm thick is plated onto the current film 82 in regions 72 and 74.

Figure 9:
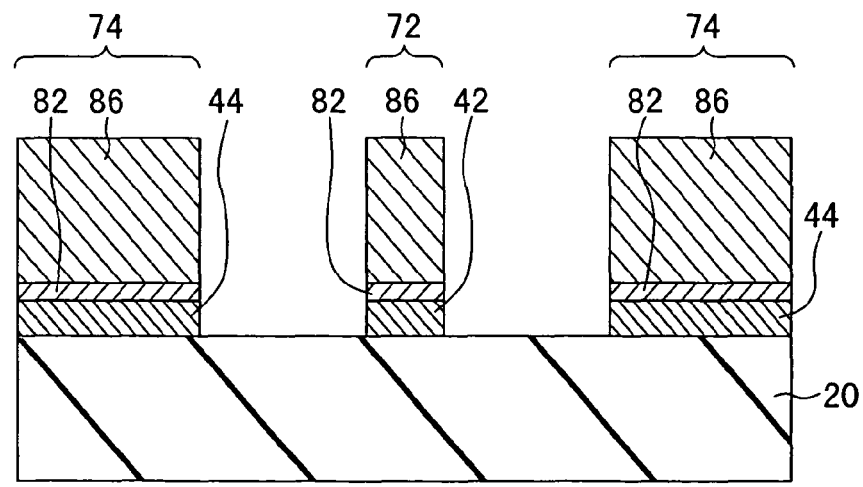

Referring to FIG. 9, next the plating resist pattern 84 (FIG. 8) is removed, the part of the current film 82 not plated with gold is removed, and the resist pattern 80 (FIG. 8) is removed.

Finally, trenches are formed in the regions between the signal line 42 and the ground conductors 44 on the major surface of the substrate by an etching process as illustrated in FIG. 5.

In the coplanar waveguide illustrated in FIG. 1, the width of the signal line 42 and the distances from the signal line 42 to the ground conductors 44 may be selected to provide a desired characteristic impedance, matching the characteristic impedance of the circuit in which the coplanar waveguide is used. A conformal mapping design method may be used, as described by Wen in 'Coplanar Waveguide: A Surface Strip Transmission Line Suitable for Nonreciprocal Gyromagnetic Device Applications', IEEE *Transactions on Microwave Theory and Techniques*, Vol. MTT-17, No. 12, pp. 1087-1090 (1969).

Figure 10:
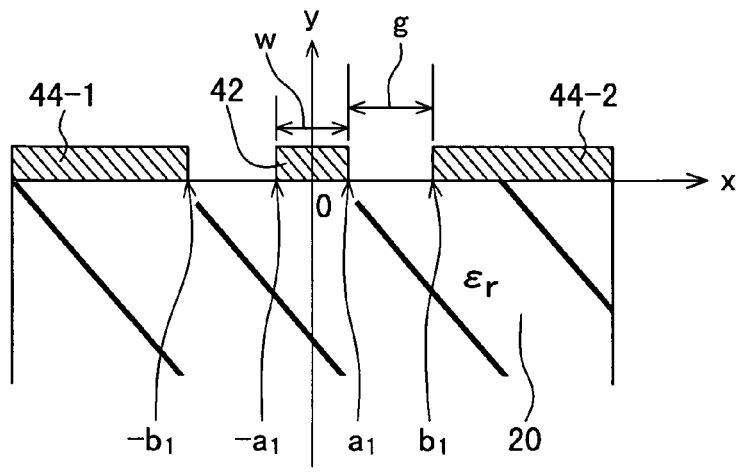
FIGS. 10 and 11 illustrate the design of a coplanar waveguide by conformal mapping.
Figure 11:
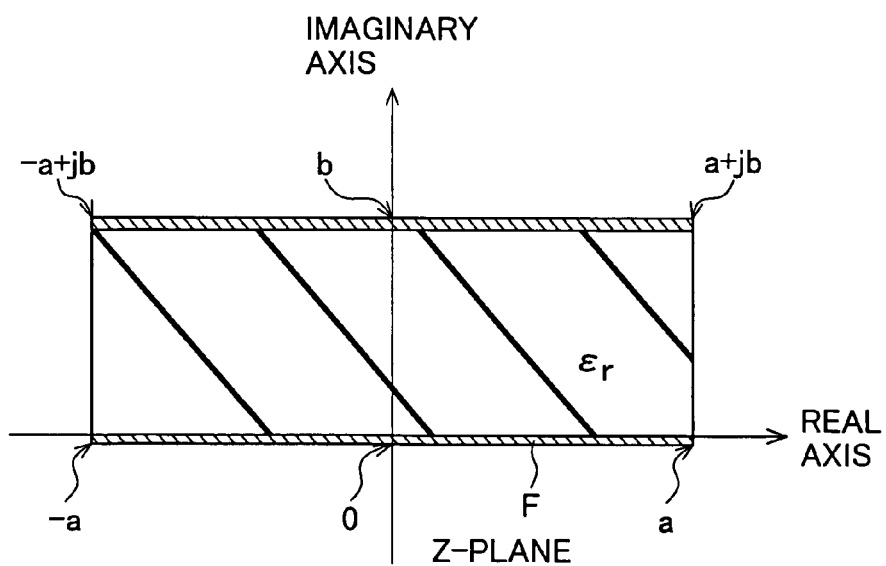

The design of a coplanar waveguide by conformal mapping will be explained with reference to the FIGS. 10 and 11. FIG. 10 shows a cross section similar to FIG. 1, in a plane perpendicular to the major surface of the substrate and to the longitudinal direction of the signal line. FIG. 11 shows a conformal mapping of the coplanar waveguide. For simplicity, FIG. 10 shows a signal line 42 and ground conductors 44-1, 44-2 formed on a substrate 20 without trenches, but the conformal mapping procedure for a trenched substrate is similar.

In FIG. 10, the axis of symmetry in the width direction of the signal line 42 is set as an origin O, the x-axis is defined as being on the surface of the substrate 20 and extending in the width direction of the signal line 42, and the y-axis is defined as being perpendicular to the x-axis and to the substrate 20. If the x-coordinates at the two edges of the signal line 42 are $-a_1$ and $a_1$, the width w of the signal line 42 is $2 \times a_1$. If the x-coordinates of the edges of the ground conductors 44-1, 44-2 on the sides facing the signal line 42 are $-b_1$ and $b_1$, respectively, the distance g from the signal line 42 to the ground conductors 44-1, 44-2 is the difference $(b_1-a_1)$ between $a_1$ and $b_1$.

If the substrate 20 is regarded as a half-plane extending to infinity in the negative y-axis direction, then as explained by Wen, conformal mapping of the coplanar waveguide in FIG. 10 produces the mapping shown in FIG. 11, in which the semi-infinite dielectric substrate 20 (FIG. 10) is mapped onto a rectangle having four vertices (−a +jb), (a +jb), (−a), (a) on a complex plane or z-plane with real and imaginary axes.

The signal line 42 and the ground conductors 44-1, 44-2 are mapped onto the upper and lower sides of this rectangle, which have length 2a. The distance g from the signal line 42 to the ground conductors 44-1, 44-2 is converted by the mapping to the length b of the left and right sides of the rectangle.

This mapping makes it possible to calculate the capacitance of the capacitive structure formed by the conductors, the substrate, and the peripheral voids, all of which constitute the coplanar waveguide.

Although the specific values of a and b in the conformal mapping are indeterminate, the ratio (a/b) of a to b can be obtained from a formula given by Wen. The capacitance of the coplanar waveguide includes a component $C_s$ formed between the conductors constituting the coplanar waveguide and the substrate, and a component $C_a$ formed between the conductors constituting the coplanar waveguide and regions other than the substrate. The values of these capacitive components $C_s$ and $C_a$ are given in terms of the above ratio (a/b) by the following equations (1-1) and (1-2), in which $\epsilon_r$ is the relative permittivity of the substrate 20 and $\epsilon_0$ is the permittivity of the vacuum.

$$C_s = 2\varepsilon_r\varepsilon_0 \frac{a}{b} \quad (1-1)$$

$$C_a = 2\varepsilon_0 \frac{a}{b} \quad (1-2)$$

The total capacitance C of the coplanar waveguide is the sum of these two components ($C=C_s+C_a$).

The phase velocity $V_p$ of an electromagnetic wave propagating along the coplanar waveguide is given by the following equation (2).

$$V_p = \sqrt{\frac{2}{\varepsilon r + 1}} C_0 \quad (2)$$

In the above equation, $C_0$ is the speed of light in a vacuum.

Accordingly, the overall characteristic impedance $Z_0$ of the coplanar waveguide is given by the following equation (3).

$$Z_0 = \frac{1}{CV_p} \quad (3)$$

Since the characteristic impedance is typically set to 50Ω in wireless communication systems, the coplanar waveguide may be designed so that the characteristic impedance value given by equation (3) is 50Ω.

A method of evaluating the coplanar waveguide will be described with reference to FIGS. 12 and 13. In the plan view in FIG. 12, conductive elements are indicated by hatching. FIG. 1 corresponds to a cross section taken through the line I-I' in FIG. 12.

Figure 12:
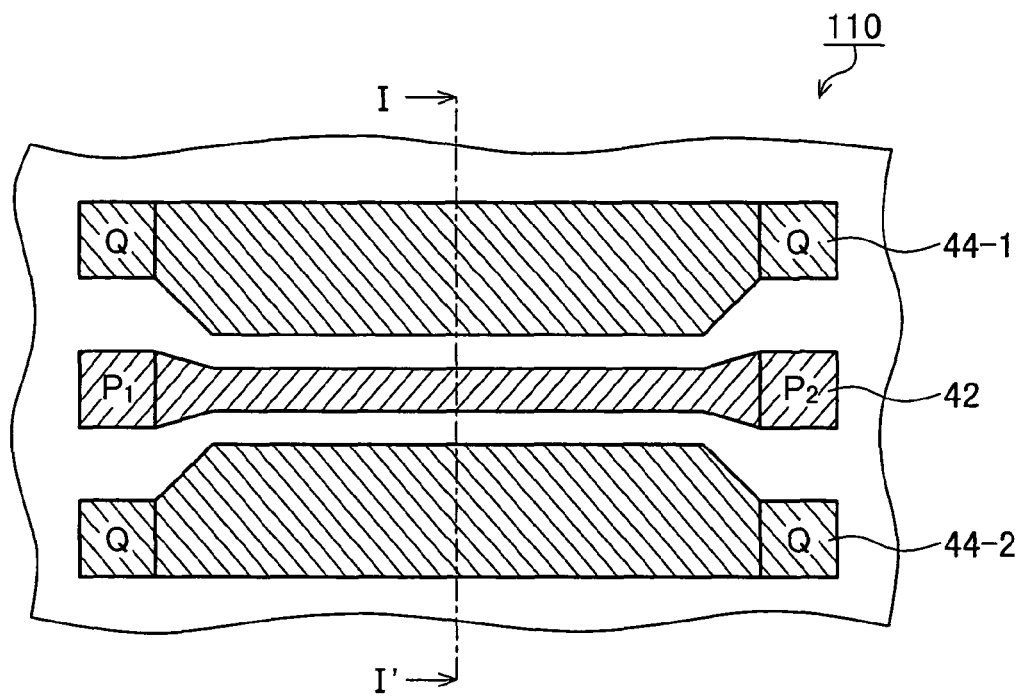
FIG. 12 is a plan view of a coplanar waveguide.

The coplanar waveguide pattern in FIG. 12 is disposed on the surface of a test substrate 110 and includes the signal line 42 and the ground conductors 44-1, 44-2. At the two ends of the signal line 42, electrode pads are formed as a first port $P_1$ and a second port $P_2$. Similarly, electrode pads are formed as ground ports Q at both ends of each of the ground conductors 44-1, 44-2.

In the exemplary configuration shown in FIG. 12, the signal line 42 and the facing sides of the pair of ground conductors 44-1, 44-2 are mutually parallel. The two ground conductors 44-1, 44-2 are equally distant from the signal line 42. The pattern is symmetrical about the longitudinal axis (not shown) of the signal line 42.

Figure 13:
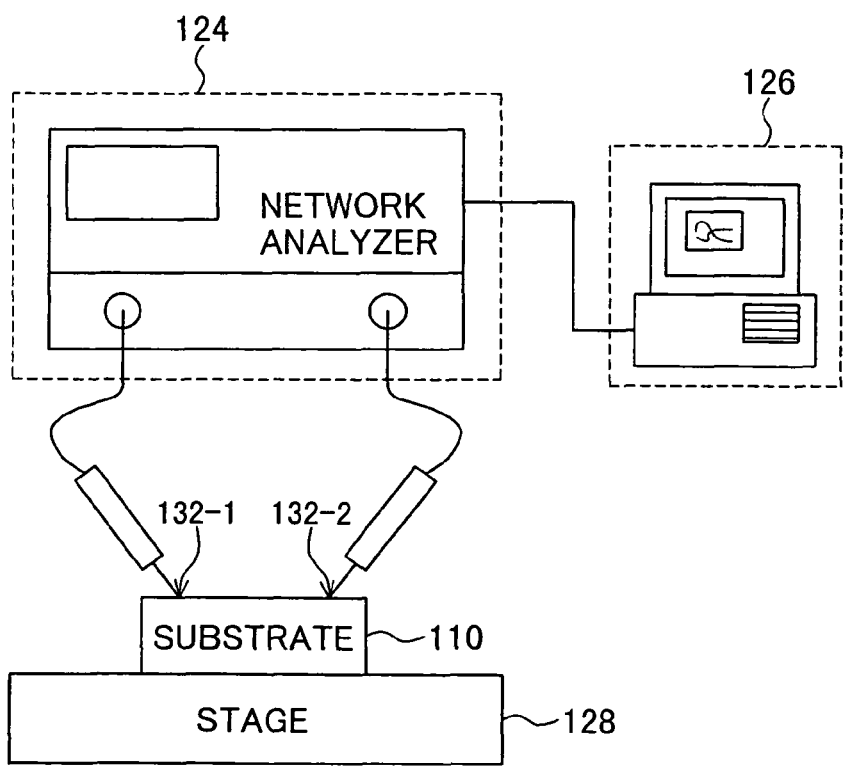
FIG. 13 shows a test setup for evaluating the coplanar waveguide in FIG. 12.

The scattering parameters or S-parameters of this coplanar waveguide configuration can be measured with the test setup shown in FIG. 13, comprising a network analyzer 124, a personal computer 126, a substrate stage 128, and probes 132-1, 132-2. A test substrate 110 on which the coplanar waveguide (FIG. 12) is formed is mounted on the stage 128. The ground ports Q at both ends of the ground conductors 44-1, 44-2 and the first and second ports $P_1$, $P_2$ of the signal line 42, as shown on FIG. 12, are connected to the network analyzer 124 through the probes 132-1, 132-2, which have a conventional coplanar structure with three electrodes each. Probe 132-1 in FIG. 13 makes contact with the three electrode pads Q, $P_1$, Q on the left side in FIG. 12; probe 132-2 makes contact with the three electrode pads Q, $P_2$, Q on the right side in FIG. 12.

Air coplanar probes available from Cascade Microtech Inc. of Beaverton, Oreg., for example, may be used as the probes 132-1, 132-2. The network analyzer should be selected according to the required measurement frequency band. Suitable network analyzers can be obtained from Agilent Technologies Inc. of Santa Clara, Calif., Anritsu Corp. of Atsugi, Japan, and other sources.

The S-matrix is used to indicate small signal characteristics at high frequencies. The matrix elements or S-parameters are expressed as power ratios of transmission and reflection signal components with respect to an input signal and can be measured even in high frequency bands. The S-matrix is a matrix with two rows and two columns, defined by the following equation (4).

$$\begin{matrix}\varepsilon_1 \\ \varepsilon_2\end{matrix} = \begin{matrix}S_{11} & S_{12} \\ S_{21} & S_{22}\end{matrix} \begin{matrix}\delta_1 \\ \delta_2\end{matrix} \quad (4)$$

In the above equation, δ1 and δ2 are column vector elements representing the power of the input signals and ∈1 and ∈2 are column vector elements representing the power of the output signals.

When the two ends of the signal line 42 are defined as the first and second ports P1, P2, respectively, an input signal δ1 is input to the first port P1 and the reflection signal ∈1 output from the first port P1 and the transmission signal ∈2 output from the second port P2 are measured. From these measurements, the reflection and transmission coefficients for the input signal δ1 input to the first port P1 are obtained and used as S-matrix elements Sll and S21. Similarly, an input signal δ2 is input to the second port P2 and the reflection signal ∈2 output from the second port P2 and the transmission signal ∈1 output from the first port P1 are measured. From these measurements, the reflection and transmission coefficients for the input signal δ2 input to the second port P2 are obtained and used as S-matrix elements S22 and S12. The S-matrix of the coplanar waveguide is thereby determined.

Accordingly, S-matrix elements $S_{11}$ and $S_{22}$ represent the reflection coefficients observed at the first and second ports $P_1$ and $P_2$, respectively; S-matrix elements $S_{12}$ and $S_{21}$ represent the transmission coefficients from the first port $P_1$ to the second port $P_2$ and from the second port $P_2$ to the first port $P_1$, respectively.

As the coplanar waveguide pattern in FIG. 12 is symmetrical with respect to the first and second ports $P_1$, $P_2$, if measurement error and environmental effects are ignored, $S_{11}$ should be equal to $S_{22}$ ($S_{11}=S_{22}$) and $S_{12}$ should be equal to $S_{21}$ ($S_{12}=S_{21}$). Environmental effects include factors such as temperature changes and electrical noise.

The S-parameters are measured with a small input signal having a frequency in the required frequency band. An attenuation constant $\alpha_m$ is calculated from the measured $S_{21}$ (or $S_{12}$) S-parameter by the following equation (5).

$$\alpha_m = -20 \frac{\log(|S_{21}|)}{H} \quad (5)$$

In the above equation, H is the distance between the two ends of the signal line forming the coplanar waveguide (the distance from the first port $P_1$ to the second port $P_2$) and corresponds to the length of the transmission line.

Figure 14:
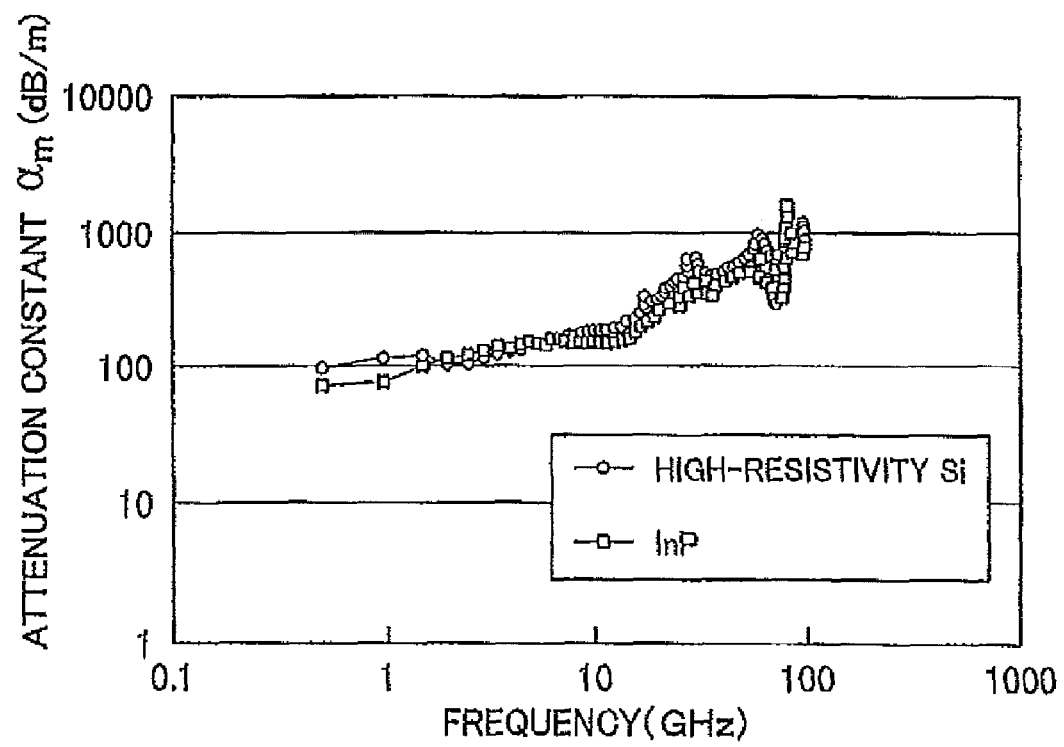
FIG. 14 is a graph illustrating the frequency dependency of the attenuation constant of coplanar waveguides formed on high-resistivity Si and InP substrates.

Attenuation constants obtained by the above procedure are shown in FIG. 14, in which the horizontal axis represents frequency in GHz and the vertical axis represents the attenuation constant $\alpha_m$ in decibels per meter (dB/m). Measurement results obtained from a coplanar waveguide formed on a high-resistivity silicon substrate with trenches according to the present invention (FIG. 1) are indicated by white circles. For comparison, measurement results obtained from a coplanar waveguide formed on an InP substrate having a resistivity of $1 \times 10^7$ Ω·cm are indicated by white squares.

The results shown in FIG. 14 indicate that even though a coplanar waveguide structured according to the present invention is formed on a silicon substrate, it has substantially the same attenuation constant as would be obtained by use of a more expensive compound semiconductor substrate.

Next, the effect on the attenuation constant of an intervening insulating film disposed between a coplanar waveguide and a high-resistivity silicon substrate will be described with reference to FIGS. 15 to 17.

Figure 15:
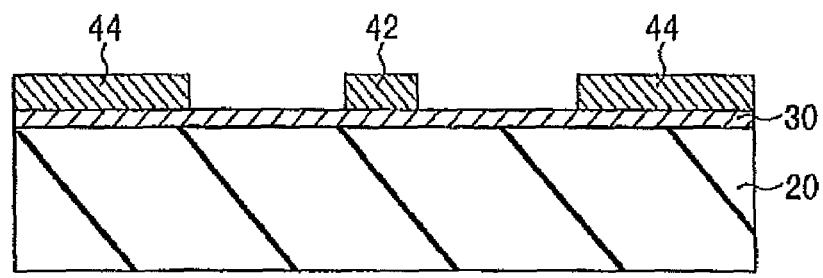
FIG. 15 is a sectional view of a coplanar waveguide formed on a high-resistivity silicon substrate with an intervening insulating film.

Referring to FIG. 15, instead of the trenches in FIG. 1, this coplanar waveguide has an insulating film 30 disposed on the substrate 20. The insulating film 30 is assumed to be a silicon nitride (SiN) film 200 nm thick covering the entire substrate surface, including the parts below the signal line 42 and ground conductors 44 and the parts therebetween.

Figure 16:
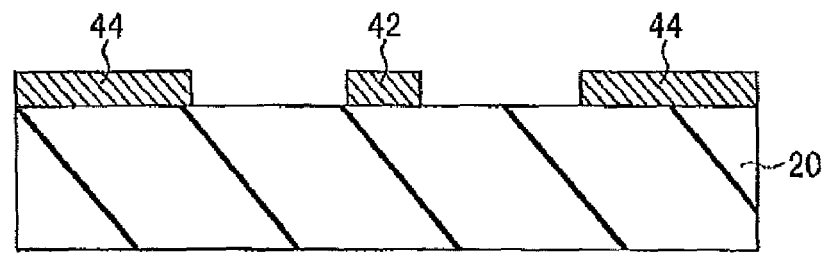
FIG. 16 is a sectional view of a similar coplanar waveguide formed on a high-resistivity silicon substrate without an intervening insulating film.

This coplanar waveguide will be compared with the coplanar waveguide in FIG. 16, which has neither an SiN film formed on the substrate 20 nor trenches formed in the substrate between the signal line 42 and the ground conductors 44. Results of attenuation measurements are shown in FIG. 17, the horizontal axis again representing frequency in GHz and the vertical axis again representing the attenuation constant $\alpha_m$ in dB/m. The measured data for the coplanar waveguide without the SiN film (FIG. 16) are indicated by white circles; the measured data for the coplanar waveguide with the SiN film (FIG. 15) are indicated by white squares.

Figure 17:
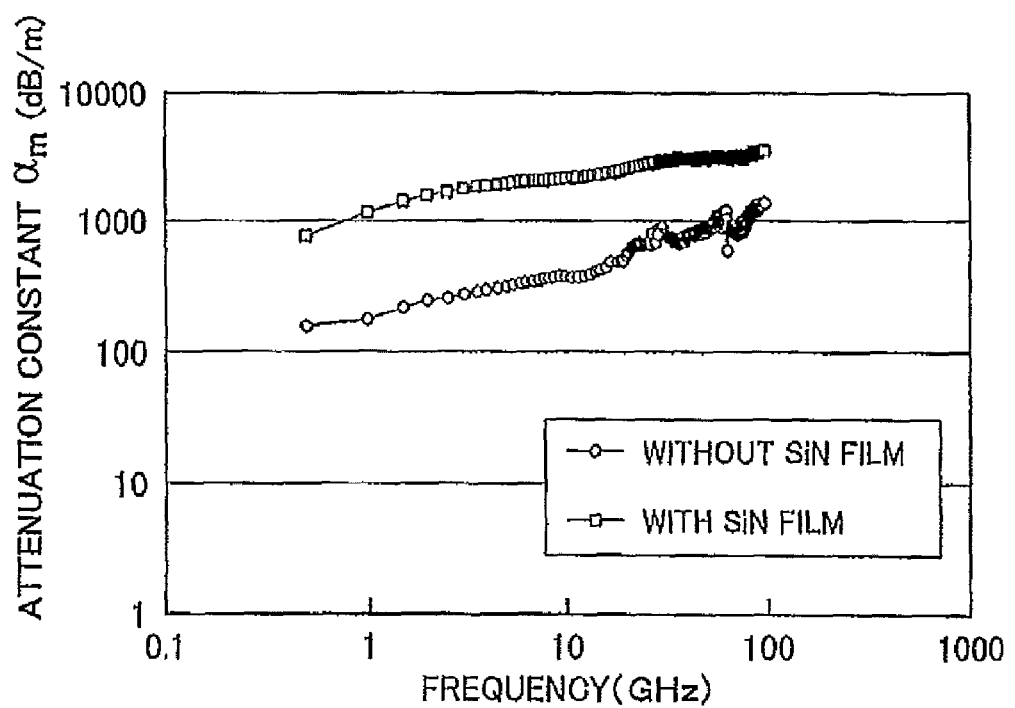
FIG. 17 is a graph illustrating the attenuation constants of the coplanar waveguides in FIGS. 15 and 16.

As can be seen in FIG. 17, the attenuation constant of the coplanar waveguide with the SiN film already exceeds 1000 dB/m at a frequency of 1 GHz. This is because a low-resistivity layer is formed at the interface between the SiN film and the high-resistivity silicon substrate, lowering the resistivity of the substrate by two orders of magnitude or more in the areas between the signal line 42 and ground conductors 44.

The coplanar waveguide without the SiN film has a better (lower) attenuation constant than the coplanar waveguide with the SiN film.

Next, the effect of trenches on the variability of the attenuation constant will be described with reference to FIGS. 18 to 20.

Figure 18:
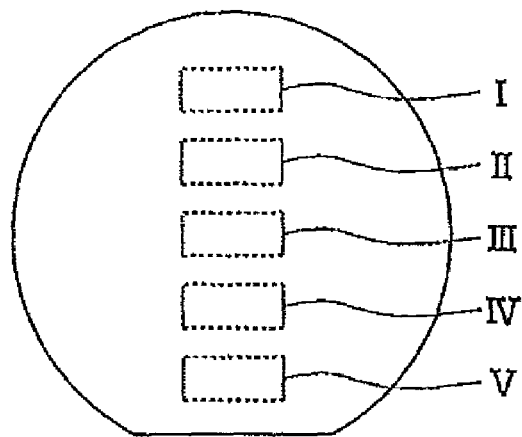
FIG. 18 indicates several regions on a high-resistivity silicon wafer.

Referring to FIG. 18, five coplanar waveguides were formed on a three-inch silicon wafer substrate in different positions on the wafer diameter, indicated as regions I, II, III, IV, and V. Attenuation constants for coplanar waveguides with and without trenches were measured, giving the results shown in FIGS. 19 and 20, where again the horizontal axis represents frequency in GHz and the vertical axis represents the attenuation constant $\alpha_m$ in dB/m.

Figure 19:
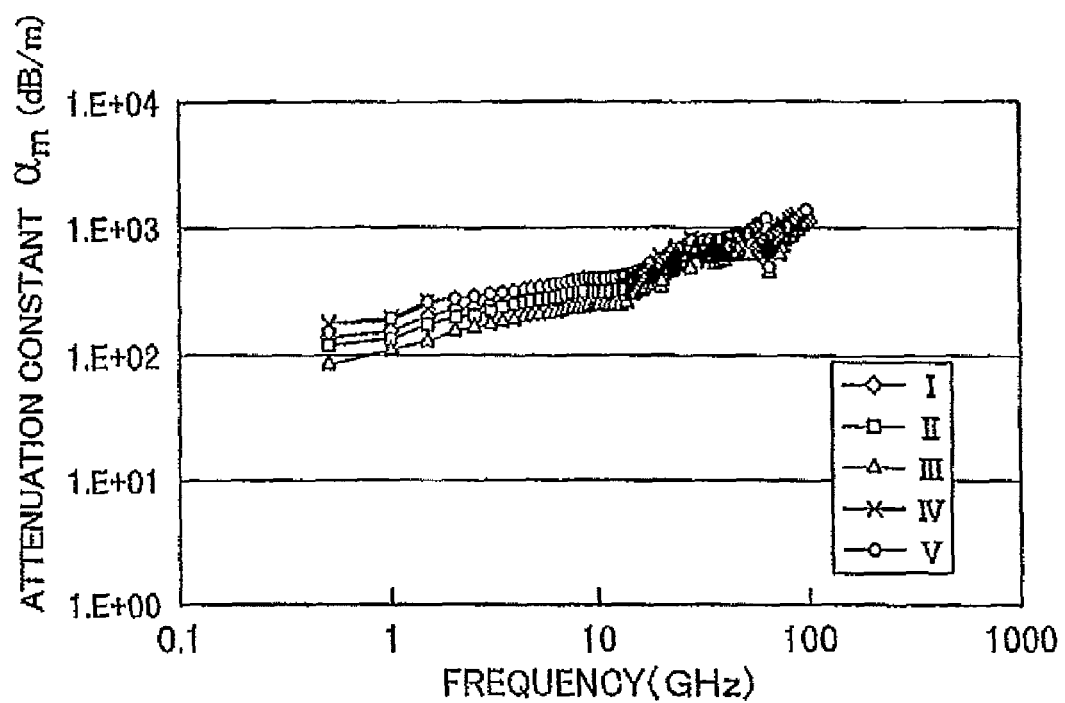
FIG. 19 is a graph illustrating the attenuation constants of coplanar waveguides formed in the regions in FIG. 18 without an intervening insulating film and without trenches.

FIG. 19 shows the results obtained from the coplanar waveguides without trenches in regions I, II, III, IV and V. Large variations in the attenuation constant at different positions on the wafer are evident. At a frequency of 50 GHz, for example, the measured attenuation constants ranged over values of about 715 ±73 dB/m.

This is because high-resistivity silicon substrates are generally fabricated by the floating zone (FZ) method, which is suitable for limiting the amount of impurity doping. Fabrication by the FZ method causes resistance variations in the wafer diameter direction.

Figure 20:
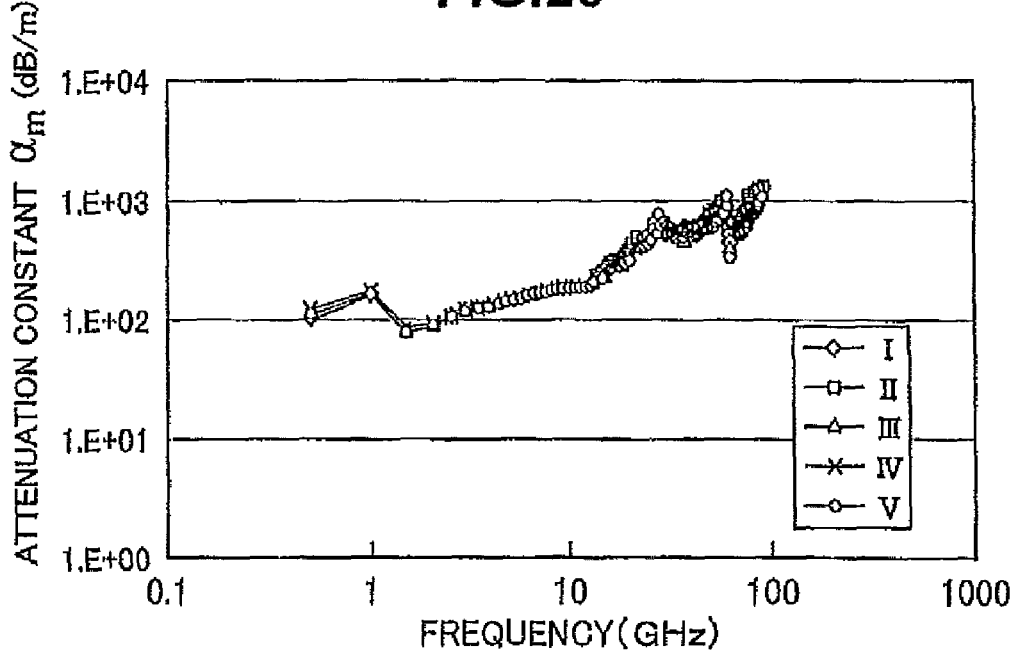
FIG. 20 is a graph illustrating the attenuation constants of coplanar waveguides formed in the regions in FIG. 18 without an intervening insulating film but with trenches.

Referring to FIG. 20, the coplanar waveguides with trenches in regions I, II, III, IV and V (had attenuation constants of 547 ±10 dB/m at a frequency of 50 GHz. That is, the trenches reduced the width of the attenuation constant distribution by a factor of more than seven, to about 14% of the width of the distribution obtained from the coplanar waveguides without trenches.

The reason for this greatly improved uniformity of the attenuation constant is thought to be that by increasing the distance from the substrate surface to the signal line, the trenches mitigate the effect of substrate resistivity variations.

A small attenuation constant variation is thus obtained across the entire wafer, so that devices having uniform characteristics can be obtained from all regions of the wafer and fabrication yields can be improved.

Since the coplanar waveguide shown in FIG. 1 does not have a surface passivation film, there is a risk that surface contamination may affect circuit operations. As seen above, however, the formation of a conventional surface passivation film such as the silicon nitride film in FIG. 15 produces a low-resistivity layer at the interface between the silicon nitride film and the silicon substrate in the areas between the signal line and the ground conductors, thereby degrading the attenuation constant.

If trenches at least 100 nm deep are formed between the signal line and the ground conductors as in FIG. 1, however, the trenches can be covered by a surface passivation film without degradation of the attenuation constant. A surface passivation film of this general type, also covering the signal line and parts of the ground conductors, will be shown later in FIGS. 23 and 27.

Figure 21:
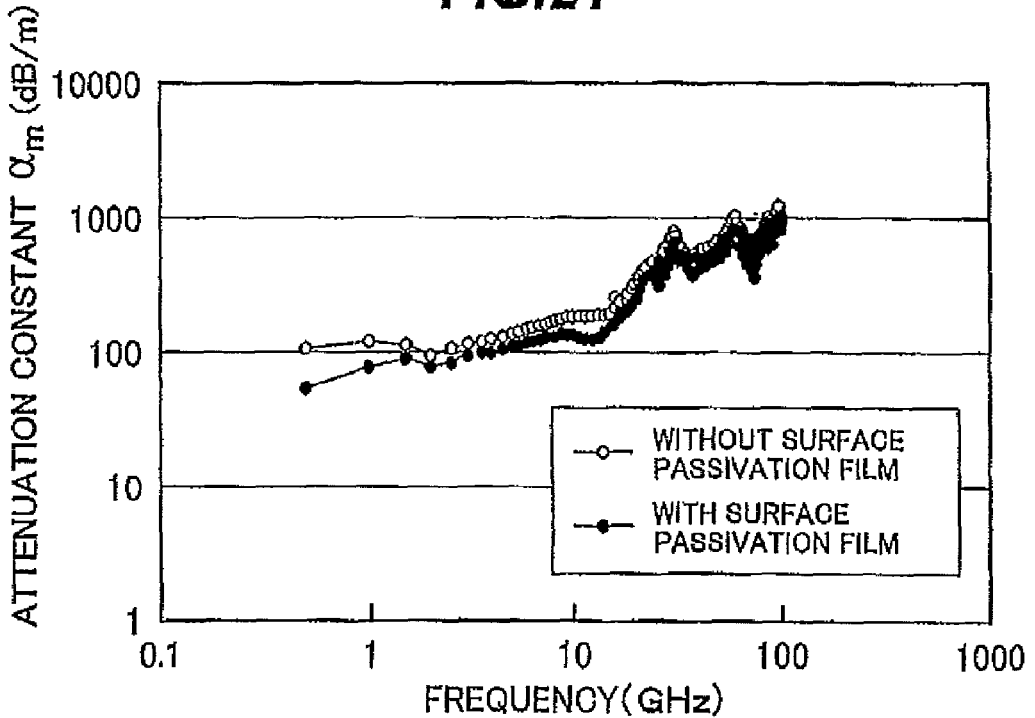
FIG. 21 is a graph illustrating the attenuation constants of coplanar waveguides formed as in FIG. 1, with and without a surface passivation film.

Attenuation constants of coplanar waveguides with and without silicon nitride (SiN) surface passivation films of this type were measured, giving the results shown in FIG. 21. The attenuation constant of the coplanar waveguide with the SiN passivation film is indicated by black circles and the attenuation constant of the coplanar waveguide without the SiN passivation film is indicated by white circles. The horizontal axis again represents frequency in GHz and the vertical axis again represents the attenuation constant $\alpha_m$ in dB/m.

Both coplanar waveguides had 100-nm trenches. It can be seen that the surface passivation film had only a slight effect on the attenuation constant. In both cases, an attenuation constant of 1000 dB/m or less was obtained at frequencies up to 100 GHz. The reason is thought to be that because of the 100-nm depth of the trenches, the low-resistivity layer formed at the interface between the SiN film and the high-resistivity substrate in the trenches was far enough away from the signal line to mitigate the adverse effect on the attenuation constant.

If a SiN film can be formed as a passivation film on a substrate surface on which a coplanar waveguide has been formed, then it is possible to interconnect the pair of ground conductors by an air-bridge interconnection. Such air bridges are commonly formed in coplanar waveguides, at intervals of about one quarter of the wavelength of the propagating electromagnetic wave, to equalize the potentials of the ground conductors.

A method of fabricating an air bridge structure will now be described with reference to FIGS. 22 to 27. The air bridge fabrication process is performed after the coplanar waveguide fabrication process described in FIGS. 2 to 5.

Figure 22:
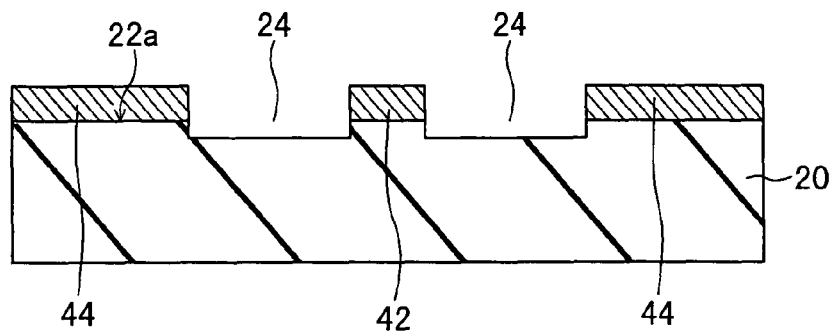
FIGS. 22 to 27 are sectional views illustrating a method of fabricating an air bridge.

Referring to FIG. 22, first a coplanar waveguide is formed by the process described in FIGS. 2 to 5.

Figure 23:
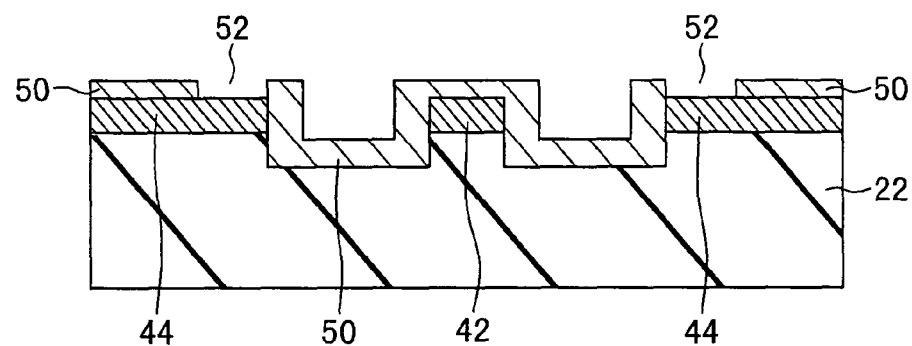

Referring to FIG. 23, next a passivation film 50 is formed on the coplanar waveguide by a conventional method such as plasma chemical vapor deposition (plasma CVD) or thermal CVD, as suitable. As the passivation film 50, an $SiO_2$ film or SiN film approximately 200 nm thick is formed. Openings 52 are then formed in the passivation film 50 over parts of the ground conductors 44 by conventional photolithography and etching processes.

Figure 24:
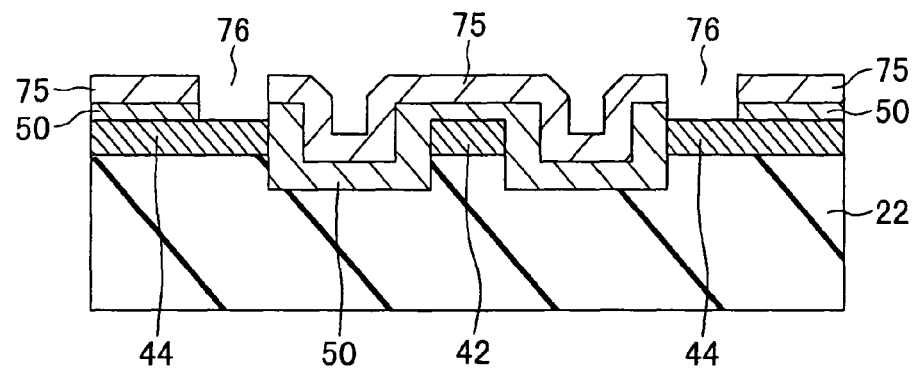

Referring to FIG. 24, next an air bridge resist pattern 75 is formed on the passivation film 50. The air bridge resist pattern 75 has openings 76 at the positions of the openings 52 (FIG. 23) formed in the passivation film 50.

Figure 25:
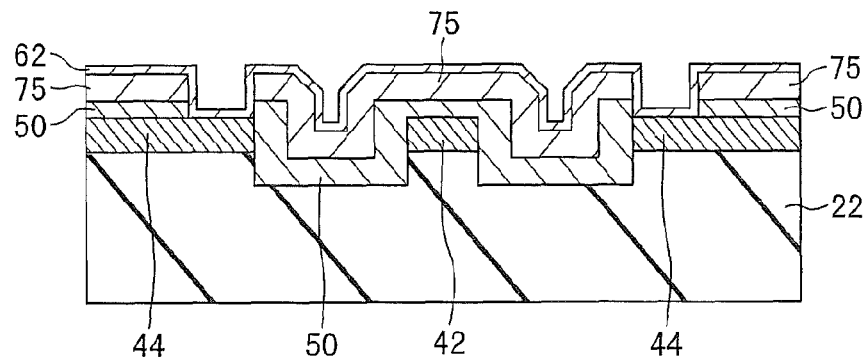

Referring to FIG. 25, next a current film 62 is formed on the air bridge resist pattern 75. The current film 62 includes a 50-nm titanium (Ti) layer and a 100-nm gold (Au) layer.

Figure 26:
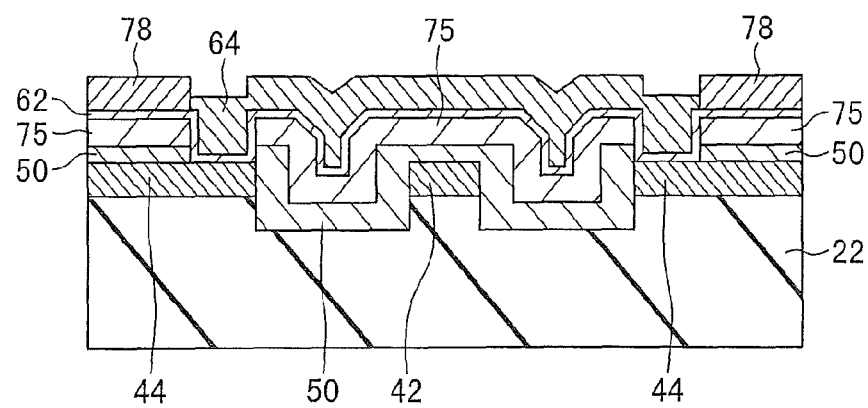

Referring to FIG. 26, next a plating resist pattern 78 is formed. The plating resist pattern 78 is formed so as to expose the regions in which air bridge interconnections will be formed, and cover other regions. After the formation of the plating resist pattern 78, gold plating, for example, is performed on the current film 62 exposed by the plating resist pattern 78, thereby forming a metallization layer 64 and obtaining the desired air bridge interconnections.

Figure 27:
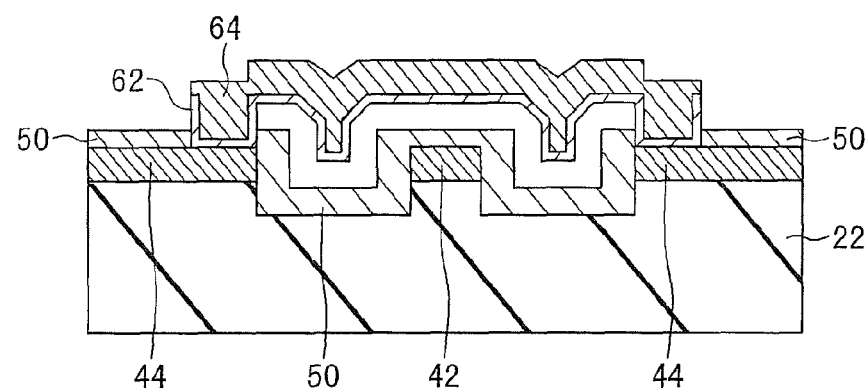

Referring to FIG. 27, the plating resist pattern 78 (FIG. 26), the part of the current film 62 on which the air bridge interconnections are not formed, and the air bridge resist pattern 75 (FIG. 26) are sequentially removed to obtain an air bridge structure with an air gap between the bridge metal 64 and the passivation film 50 covering the signal line 42.

As described above, a low-resistivity layer produced at the interface between a high-resistivity silicon substrate and an intervening insulating film, extending from the areas below the signal line and ground conductors across the spaces therebetween, can increase the attenuation constant of a coplanar waveguide. Therefore, in the coplanar waveguide according to the invention, the signal line and ground conductors are formed directly on the high-resistivity silicon substrate with no intervening insulating film, leaving no interface below the signal line and ground conductors where a low-resistivity layer might form. As a result, the coplanar waveguide can operate in the millimeter-wave frequency band.

In addition, the trenches in the high-resistivity silicon substrate between the signal line and the ground conductors increase the distance from the substrate surface to the signal line and therefore mitigate the effect of substrate resistivity variations. Variations in the attenuation constant are thereby reduced and devices having uniform characteristics are obtained from all parts of production wafers, improving manufacturing yields.

Furthermore, if the coplanar waveguide and trenches are covered with a passivation film such as a silicon nitride film, since the trenches increase the distance from the substrate surface to the signal line, even if a low-resistivity layer forms at the interface between the substrate and the passivation film in the trenches, the effect of the low-resistivity layer is mitigated.

It is therefore possible to form a passivation film on the coplanar waveguide and interconnect the pair of ground conductors by an air bridge.

Various embodiments of the invention have been described above, but those skilled in the art will recognize that further variations are possible within the scope of the invention, which is defined in the appended claims.

What is claimed is:

1. A coplanar waveguide comprising:
a silicon substrate having a major surface;
a signal line disposed on the major surface of the silicon substrate;
a pair of ground conductors disposed on the major surface of the silicon substrate on mutually opposite sides of the signal line, a pair of trenches being disposed on said major surface between the signal line and the pair of ground conductors, the pair of trenches having respective inside surfaces; and
a passivation film covering the signal line and said respective inside surfaces.

2. The coplanar waveguide of claim 1, wherein the pair of trenches extend at least one hundred nanometers deep from the major surface of the silicon substrate.

3. The coplanar waveguide of claim 1, wherein the silicon substrate comprises monocrystalline silicon.

4. The coplanar waveguide of claim 1, wherein the silicon substrate has a resistivity of at least one thousand ohm-centimeters.

5. The coplanar waveguide of claim 1, further comprising at least one conductive bridge interconnecting the pair of ground conductors, the conductive bridge passing over the signal line.

6. A method of fabricating a coplanar waveguide, comprising:
forming a signal line and a pair of ground conductors on a major surface of a silicon substrate, the signal line being disposed between the pair of ground conductors; and
forming a pair of trenches in said major surface of between the signal line and the pair of ground conductors, the pair of trenches having inside surfaces; and
forming a passivation film covering the signal line and said inside surfaces of the pair of trenches.

7. The method of claim 6, wherein forming the signal line and the pair of ground conductors further comprises plating a layer of gold onto the signal line and the pair of ground conductors.

8. The method of claim 6, further comprising forming at least one conductive bridge interconnecting the pair of ground conductors.

9. The method of claim 6, wherein the pair of trenches extend at least one hundred nanometers deep from the major surface of the silicon substrate.

10. The method of claim 6, wherein the silicon substrate comprises monocrystalline silicon.

11. The method of claim 6, wherein the silicon substrate has a resistivity of at least one thousand ohm-centimeters.

12. The method of claim 6, wherein forming the pair of trenches further comprises using the signal line and the pair of ground conductors as an etching mask.

13. The method of claim 6, wherein forming the pair of trenches further comprises wet etching.

14. The method of claim 6, wherein forming the pair of trenches further comprises reactive ion etching.

15. The method of claim 14, wherein the reactive ion etching is carried out with silicon hexafluoride gas.

16. The method of claim 14, wherein the reactive ion etching is carried out with carbon tetrafluoride gas.

17. A coplanar waveguide, comprising:
 a silicon substrate having a major surface;
 a signal line disposed on said major surface;
 a pair of ground conductors disposed on said major surface on mutually opposite sides of the signal line, a pair of trenches being disposed on said major surface between the signal line and the pair of ground conductors, the pair of trenches having respective inside surfaces;
 a passivation film covering the signal line and said respective inside surfaces; and
 at least one conductive bridge interconnecting the pair of ground conductors; wherein
 an air gap is disposed between the passivation film and the conductive bridge.

* * * * *